(12) United States Patent
Mohr et al.

(10) Patent No.: US 7,276,955 B2
(45) Date of Patent: Oct. 2, 2007

(54) CIRCUIT AND METHOD FOR STABLE FUSE DETECTION

(75) Inventors: Christian N. Mohr, Plano, TX (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 11/106,100

(22) Filed: Apr. 14, 2005

(65) Prior Publication Data

US 2006/0232323 A1 Oct. 19, 2006

(51) Int. Cl.
  *H01H 37/76* (2006.01)
(52) U.S. Cl. .......................................... 327/525; 327/20
(58) Field of Classification Search ...................... None
  See application file for complete search history.

(56) References Cited

U.S. PATENT DOCUMENTS

| | | | |
|---|---|---|---|
| 4,837,520 A * | 6/1989 | Golke et al. ................. | 324/550 |
| 5,424,672 A | 6/1995 | Cowles et al. | |
| 6,239,652 B1 * | 5/2001 | Oh et al. .................... | 327/541 |
| 6,262,924 B1 * | 7/2001 | Fukutani et al. ............ | 365/200 |
| 6,285,619 B1 * | 9/2001 | Daniel et al. ............ | 365/225.7 |
| 6,356,139 B1 * | 3/2002 | Lee ............................. | 327/537 |
| 6,462,609 B2 * | 10/2002 | Hashimoto et al. ......... | 327/525 |
| 6,633,506 B2 | 10/2003 | Casper et al. | |
| 6,693,481 B1 * | 2/2004 | Zheng ......................... | 327/525 |
| 6,717,887 B1 * | 4/2004 | Kono et al. ................. | 365/233 |
| 6,818,957 B2 | 11/2004 | Hasegawa | |
| 6,847,574 B2 | 1/2005 | Santin | |
| 6,858,916 B2 | 2/2005 | Sakoh | |
| 6,956,772 B2 | 10/2005 | Forbes | |
| 7,038,523 B2 * | 5/2006 | Kim et al. .................. | 327/407 |
| 2005/0041492 A1 * | 2/2005 | Kim ........................... | 365/200 |

\* cited by examiner

*Primary Examiner*—Cassandra Cox
(74) *Attorney, Agent, or Firm*—Jones Day; Edward L. Pencoske

(57) ABSTRACT

A fuse state detection circuit is comprised of a first fuse element, a second fuse element, and an output for carrying an output signal, the output signal represents a first logic state when the first fuse element is blown and the second fuse element is unblown and the output signal represents a second logic state when the first element is unblown and the second element is blown. The fuse state detection circuit produces an output signal whose state is recoverable from a negative triggering event and is capable of resolving itself to the correct state without the need for a reset pulse. Methods of using the fuse state detection circuit, such as a method of using fuse elements to control a setting within an electronic circuit, the improvement comprising using a pair of fuse elements to control a single setting, are also given.

38 Claims, 6 Drawing Sheets

CIRCUIT AND METHOD FOR STABLE FUSE DETECTION

BACKGROUND

The present invention relates generally to integrated circuits and more particularly to a circuit and/or method for detecting fuse states in an integrated circuit.

Fuse elements (such as laser fuses, anti-fuses, transistors, etc.) are used to establish a variety of settings within an integrated circuit. In a memory device, for example, fuse elements may be used to establish the part configuration (e.g., X4/X8/X16) and/or various trimming settings (such as voltage levels, part timings, row and column repair/replacement, etc). One type of fuse that is utilized is referred to as a "laser fuse." Typically, the memory device includes one or more strips of metal within a circuit that may be programmed, or "blown", using a laser. The blown laser fuse causes a latch to be set to a specific state within the circuit. The state of the latch may then be used to set the operation of the memory device. Because a laser is used to program the laser fuses, the fuse setting process must be completed prior to memory device packaging. Accordingly, laser fuse settings cannot be modified after packaging is complete.

Another type of fuse element that is utilized is referred to as an "anti-fuse". In an "unblown" (i.e., unprogrammed) condition, an anti-fuse functions as a capacitor presenting a very high resistance on the order of 10 Megohms to the circuit in which it is placed. In a "blown" (i.e., programmed) condition, the connections of the anti-fuse are shorted together (using a very high voltage, for example) providing a relatively low resistance (approximately 200 to 500 ohms) path through the anti-fuse. Because a laser is not required for programming, anti-fuses can be programmed after device packaging is completed.

FIG. 5 is a detailed view of a fuse state detection circuit 100 according to the prior art. The fuse state detection circuit 100 produces an output signal (X) having either a logic 1 (i.e., Vcc level) or a logic 0 (i.e., ground level). The output signal X is responsive to the state of the anti-fuse 106. For example, the fuse state detection circuit 100 illustrated in FIG. 5 produces an output signal X with logic 1 (i.e., Vcc) if anti-fuse 106 is "blown" and with logic 0 (i.e., GND) if anti-fuse 106 is "unblown".

The operation of the prior art fuse state detection circuit 100 will now be discussed in more detail. The signals CGND, FA, BSELY_, MRG_, and DVC2F are used for programming the anti-fuse 106 and/or reading the state of anti-fuse 106. When the memory device is operating under normal conditions, it is assumed that CGND=logic 0, FA=logic 0, BSELY_=logic 0, MRG_=logic 0, and DVC2F=logic 1. Under these conditions, the fuse state detection circuit 100 can be "simplified" as illustrated in FIG. 6.

The simplified circuit illustrated in FIG. 6 is basically a simple latch with a reset p-channel transistor M2 and anti-fuse 106. The output of the latching circuit (i.e., signal X) is responsive to (and thus indicates) the state of anti-fuse 106. As seen in FIG. 6 when anti-fuse 106 is "blown", anti-fuse 106 functions as a resistor and the voltage at node A is set at logic 0 (i.e., pulled to GND). Inverter 104 inverts the voltage present at node A such that when anti-fuse 106 is "blown," the output signal X of fuse state detection circuit 100 is set to logic 1 (i.e., representing that anti-fuse 106 is blown).

When anti-fuse 106 is unblown, node A is floating because anti-fuse 106 acts as a capacitor, isolating node A from GND. In this case, the state of the Read Fuse signal (RDFUS_) is used to determine the logic state of output signal X. Initially, RDFUS_pulses "low," turning on p-channel transistor M2 and pulling node A to logic 1 (i.e., to Vcc). Accordingly inverter 104 inverts the voltage present at node A setting the logic state of output signal X to logic 0 (i.e., representing that anti-fuse 106 is unblown). When RDFUS_ returns "high" (i.e., when the "low" pulse times out), p-channel transistor M2 is turned off and feedback inverter 102 latches the logic state of output signal X at logic 0 (i.e., which continues to represent that anti-fuse 106 is unblown).

As is apparent from the above-description, when anti-fuse 106 is unblown the output state of fuse state detection circuit 100 is dependent upon the ability of the feedback inverter 102 to latch. Due to its weak driving signal, however, the latching ability of feedback inverter 102 may be easily overcome. Thus, the fuse state detection circuit 100 is susceptible to negative triggering events. A negative trigger event refers to any event that causes a node or point within a circuit to undesirably change states (e.g., to cause a node or point to change from a negative logic to a positive logic and/or to cause a node or point to change from a positive logic to negative logic). A negative triggering event may or may not cause the output of the fuse state detection circuit 100 to produce and erroneous signal X. Negative triggering events may be caused by voltage spikes due to signal coupling, a radiation particle strike, power bus drop, and/or a collection of positive or negative charge which can lead to circuit instability, among others.

If a negative triggering event occurs, the fuse state detection circuit 100 may produce an erroneous output signal X. For example, assume that anti-fuse 106 is unblown. As discussed above, node A is set to logic 1 and the output signal X set at logic 0. If a negative triggering event overcomes the latching ability of feedback inverter 102, node A is forced to logic 0 and output signal X is forced to logic 1 erroneously representing that anti-fuse 106 is blown. If this were to happen, the device responsive to output signal X may not work properly. Fuse state detection circuit 100 requires that a new RDFUS_pulse be applied to reset the latch.

Although periodically pulsing RDFUS_to reset the latch 102 seems like an easy solution to the problem, such pulsing typically requires large amounts of current. More specifically, because some devices may include up to 10,000 anti-fuses, each with a fuse state detection circuit, a large amount of current is consumed each time the RDFUS_signal is pulsed. Accordingly, during normal operation RDFUS_is pulsed very infrequently to reduce the amount of current consumed by the device.

Thus, there exists a need for a fuse state detection circuit that resists negative triggering events, that resets itself without using a RDFUS_pulse should a negative triggering event cause the fuse state detection circuit to produce an erroneous output signal, and which overcomes other limitations inherent in prior art.

SUMMARY

One aspect of this disclosure relates to a fuse state detection circuit comprising a first fuse element, a second fuse element, and circuitry responsive to the first and second fuse elements for producing an output signal assuming a first logic state when the first fuse element is blown and the second fuse element is unblown and a second logic state when the first element is unblown and the second element is blown.

Another aspect of this disclosure relates to a fuse state detection circuit comprising a first fuse element, a second fuse element, and circuitry responsive to the first and second fuse elements so as to produce an output signal whose state is resistant to a negative triggering event.

Another aspect of this disclosure relates to a fuse state detection circuit comprising a first fuse element, a second fuse element, and circuitry responsive to the first and second fuse elements for producing an output signal capable of resolving itself to the correct state without the need for a reset pulse.

Another aspect of this disclosure relates to a method of using fuse elements to control a setting within an electronic circuit, the improvement comprising using a pair of fuse elements to control a single setting.

Another aspect of this disclosure relates to a method of operating a fuse state detection circuit comprising monitoring the state of a first fuse element, monitoring the state of a second fuse element, and producing an output signal that assumes a first logic state when the first fuse element is blown and the second fuse element is unblown and a second logic state when the first element is unblown and the second element is blown.

Another aspect of this disclosure relates to a method of operating a fuse state detection circuit comprising monitoring the state of a first fuse element, monitoring the state of a second fuse element, and producing an output signal that is responsive to the states of the first and the second fuse elements and whose state is resistant to a negative triggering event.

Another aspect of this disclosure relates to a method of operating a fuse state detection circuit comprising monitoring the state of a first fuse element, monitoring the state of a second fuse element, and producing an output signal that is responsive to the states of the first and the second fuse elements and resolves itself to the correct state without the need for a reset pulse.

Another aspect of this disclosure relates to a memory device comprising an array of memory cells, a plurality of peripheral devices for reading data out of and writing data into the array of memory cells, the peripheral devices comprising a fuse state detection circuit comprising a first fuse element, a second fuse element, and circuitry responsive to the first and second fuse elements for producing an output signal assuming a first logic state when the first fuse element is blown and the second fuse element is unblown and a second logic state when the first element is unblown and the second element is blown.

Another aspect of this disclosure relates to a memory device comprising an array of memory cells, a plurality of peripheral devices for reading data out of and writing data into the array of memory cells, the peripheral devices comprising a fuse state detection circuit comprising a first fuse element, a second fuse element, and circuitry responsive to the first and second fuse elements so as to produce an output signal whose state is resistant to a negative triggering event.

Another aspect of this disclosure relates to a memory device comprising an array of memory cells, a plurality of peripheral devices for reading data out of and writing data into the array of memory cells, the peripheral devices comprising a fuse state detection circuit comprising a first fuse element, a second fuse element, and circuitry responsive to the first and second fuse elements for producing an output signal capable of resolving itself to the correct state without the need for a reset pulse.

Another aspect of this disclosure relates to a system, comprising a processor, a memory device, and a bus for connecting the processor to the memory device, the memory device comprising an array of memory cells, a plurality of peripheral devices for reading data out of and writing data into the array of memory cells, the peripheral devices comprising a fuse state detection circuit, comprising a first fuse element, a second fuse element, and circuitry responsive to the first and second fuse elements for producing an output signal assuming a first logic state when the first fuse element is blown and the second fuse element is unblown and a second logic state when the first element is unblown and the second element is blown.

Another aspect of this disclosure relates to a system, comprising a processor, a memory device, and a bus for connecting the processor to the memory device, the memory device comprising an array of memory cells, a plurality of peripheral devices for reading data out of and writing data into the array of memory cells, the peripheral devices comprising a fuse state detection circuit comprising a first fuse element, a second fuse element, and circuitry responsive to the first and second fuse elements so as to produce an output signal whose state is resistant to a negative triggering event.

Another aspect of this disclosure relates to a system, comprising a processor, a memory device, and a bus for connecting the processor to the memory device, the memory device comprising an array of memory cells, a plurality of peripheral devices for reading data out of and writing data into the array of memory cells, the peripheral devices comprising a fuse state detection circuit comprising a first fuse element, a second fuse element, and circuitry responsive to the first and second fuse elements for producing an output signal capable of resolving itself to the correct state without the need for a reset pulse.

BRIEF DESCRIPTION OF THE DRAWINGS

To enable the present invention to be easily understood and readily practiced, the present invention will now be described for purposes of illustration and not limitation, in connection with the following figures wherein.

DETAILED DESCRIPTION

The detailed description sets forth specific embodiments which are described in sufficient detail to enable those skilled in the art to practice the present invention. It should be apparent to those skilled in the art that other embodiments may be utilized, and that logical, mechanical, and electrical changes may be made, while remaining within the scope of the present invention. The following detailed description is, therefore, not to be taken in a limiting sense, and the scope of the invention is defined only by the appended claims.

Figure 1:
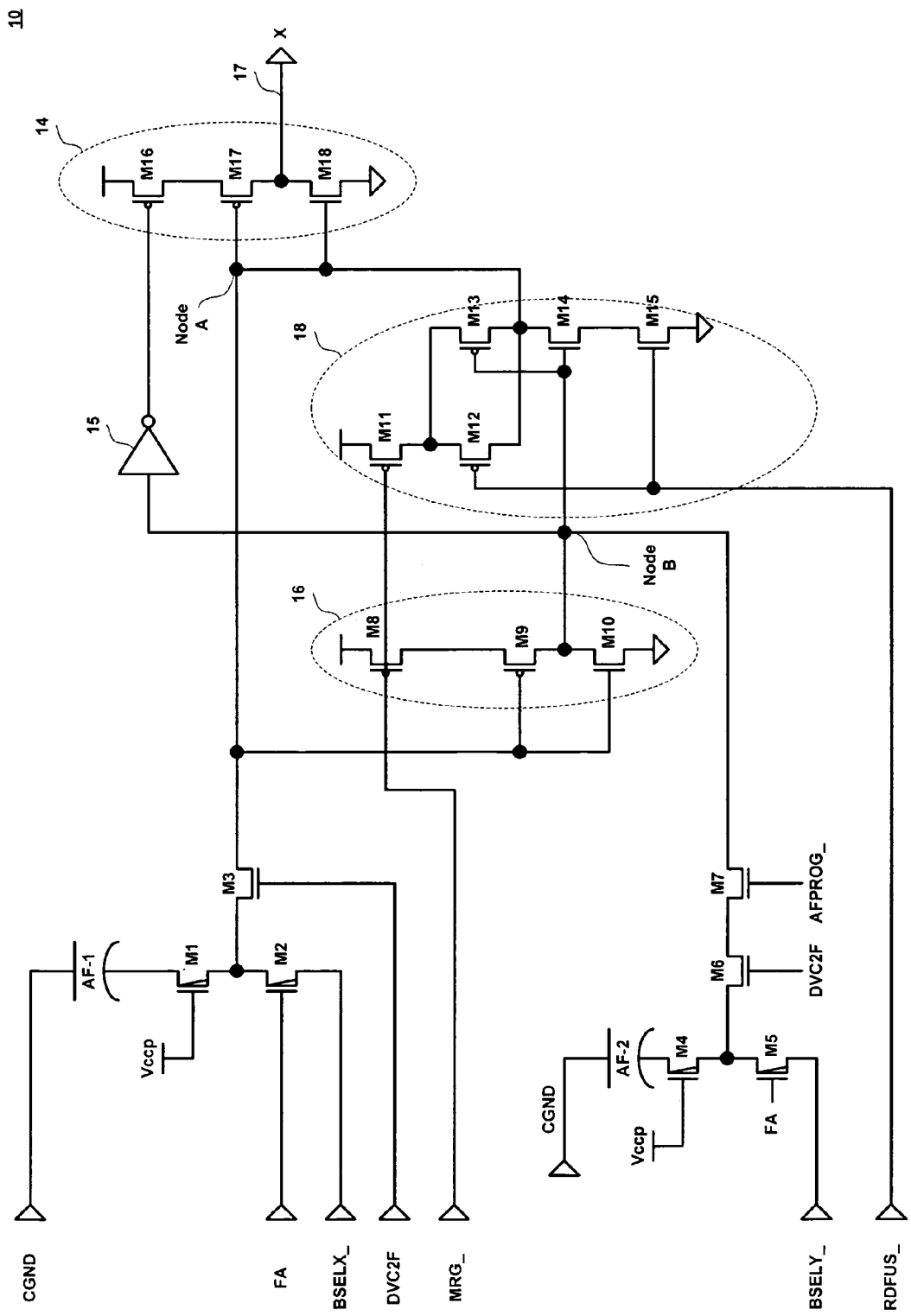
FIG. 1 is a detailed schematic of a fuse state detection circuit according to one embodiment.

FIG. 1 is a detailed schematic of a fuse state detection circuit 10 according to one embodiment. Fuse state detection circuit 10 includes two fuse elements (e.g., anti-fuses AF-1 and AF-2), three inverters (14, 15, and 16), and an NAND gate (18), among others. Briefly, fuse state detection circuit 10 uses the two fuse elements (AF-1, AF-2) to produce an output signal X representing a programming state. Fuse state detection circuit 10 is capable of producing the output signal X without requiring a fuse sample pulse. In the current embodiment, polling of the fuse element state is unnecessary as the fuse state detection circuit 10 constantly monitors itself to determine the correct programming state. Fuse state detection circuit 10 consumes less power and provides improved stability for setting various device functions while maintaining all of the current functionality and testability requirements associated with fuse detection.

Some considerations for defining the functionality of the fuse state detection circuit 10 are as follows. Prior to any programming attempts, the fuse state detection circuit 10 is initialized. More specifically, the output signal X is forced to model a predetermined programming state (e.g., "unblown") using the RDFUS_signal. Due to the use of multiple fuse elements (e.g., AF-1, AF-2), the fuse elements require independent addressing (e.g., BSELX_, BSELY_, etc.) for reading the programming state or blowing the fuse elements. When a desired programming state is attempted, one of the two fuse elements (AF-1, AF-2) must be blown. Both fuses should not be blown to set the programming state of fuse state detection circuit 10. By leaving both fuses unblown, it is possible to achieve back-end or post-repair repair. In this situation, the initial RDFUS_pulse allows the output state to be defined as modeling an unblown fuse state, however, in this case the extra protection provided by this circuit implementation against various negative triggering events may be lost. An n-channel pass transistor may be added to provide a logical fuse read function while not creating a current fight. For example, n-channel pass transistor M7 provides such a logical fuse read function.

By considering these cases, the output of fuse state detection circuit 10 is resistant to various negative triggering events (e.g., voltage spikes due to signal coupling, radiation particle strike, power bus drop, and/or a collection of positive or negative charge which can lead to circuit instability, among others). As discussed above, a negative triggering event refers to any event that causes a node or point within a circuit to undesirably change states (e.g., to cause a node or point to change from a negative logic to a positive logic and/or to cause a node or point to change from a positive logic to negative logic). A negative triggering event may or may not cause the output of the fuse state detection circuit 10 to produce and erroneous signal X. Additionally, under the assumption that one of the two fuse elements is always blown, any upset to the fuse state detection circuit 10 should allow it to resolve itself to the correct output state within a reasonable amount of time and without the need for a set/reset pulse.

Turning now to a detailed description of FIG. 1, fuse elements AF-1 and AF-2 (as discussed above) are anti-fuses in the current embodiment. A first terminal of anti-fuse AF-1 is connected to the signal CGND, while a second terminal of anti-fuse AF-1 is connected to the drain of transistor M1. The drain and gate terminals of transistor M1 are connected to the second terminal of anti-fuse AF-1 and a boosted voltage source (e.g., Vccp), respectively. The source terminal of transistor M1 is connected to the drain of transistor M2 and the source of transistor M3. The source and gate terminals of transistor M2 are connected to the signal FA and the signal BSELX_, respectively. The drain terminal of transistor M2 is connected to the source of transistor M1 and the source of transistor M3. The gate and drain terminals of transistor M3 are connected to the signal DVC2F and node A, respectively, whereas the source of transistor M3 is connected to the source of transistor M1 and the drain of transistor M2.

A first terminal of anti-fuse AF-2 is connected to the signal CGND, while a second terminal of anti-fuse AF-2 is connected to the drain of transistor M4. The drain and gate terminals of transistor M4 are connected to the second terminal of anti-fuse AF-2 and a boosted voltage source (e.g., Vccp), respectively. The source terminal of transistor M4 is connected to the drain of transistor M5 and the source of transistor M6. The source and gate terminals of transistor M5 are connected to the signal FA and the signal BSELY_, respectively. The drain terminal of transistor M5 is connected to the source of transistor M4 and the source of transistor M6. The gate and drain terminals of transistor M6 are connected to the signal DVC2F and the source terminal of transistor M7, respectively, whereas the source of transistor M6 is connected to the source of transistor M4 and the drain of transistor M5. The source, gate, and drain terminals of transistor M7 are connected to the drain of transistor M6, the signal AFPROG_, and node B, respectively.

Inverter 14 is comprised of transistors M16, M17, and M18. The source, gate, and drain terminals of transistor M16 are connected to a voltage source (e.g., Vcc), the output terminal of inverter 15, and the source of transistor M17, respectively. The input terminal of inverter 15 is connected to node B. The source, gate, and drain terminals of transistor M17 are connected to the drain of transistor M16, node A, and the output 17 of fuse state detection circuit 10, respectively. The source, gate, and drain terminals of transistor M18 are connected to output 17, node A, and GND, respectively.

Inverter 16 is comprised of transistors M8, M9, and M10. The source, gate, and drain terminals of transistor M8 are connected to a voltage source (e.g., Vcc), the signal MRG_and the source of transistor M9, respectively. The source, gate, and drain terminals of transistor M9 are connected to the drain of transistor M8, node A, and node B, respectively. The source, gate, and drain terminals of transistor M10 are connected to node B, node A, and GND, respectively.

NAND gate 18 is comprised of transistors M11, M12, M13, M14, and M15. The source, gate, and drain terminals of transistor M11 are connected to a voltage source (e.g., Vcc), the signal MRG_and the sources of transistors M12 and M13, respectively. The gate and drain terminals of transistor M12 are connected to the signal RDFUS_and node A, respectively, whereas the source of transistor M12 is connected to the drain of transistor M11 and the source of transistor M13. The gate and drain terminals of transistor M13 are connected to node B and node A, respectively, whereas the source of transistor M13 is connected to the drain of transistor M11 and the source of transistor M12. The source, gate, and drain terminal of transistor M14 are connected to node A, node B, and the source of transistors M15, respectively. The source, gate, and drain terminals of transistor M15 are connected to the drain of transistor M14, the signal RDFUS_, and GND, respectively. In the current embodiment; transistors M1-M7, M10, M14-M15, and M18 are n-channel transistors, whereas transistors M8-M9, M11-M13, and M16-M17 are p-channel transistors.

It should be noted that the specific embodiment of fuse state detection circuit 10 illustrated in FIG. 1 is in no way intended to limit the scope of the present invention. For example, it should be apparent to one skilled in the art that the number and types of fuse elements, transistors, logic devices, etc. utilized by fuse state detection circuit 10 and the specific layout of said components as illustrated in the FIG. 1 may be altered while remaining with scope of the present invention.

The operation of the fuse state detection circuit 10 will now be discussed in more detail. The signals CGND, FA, BSELX_, BSELY_, MRG_, and DVC2F are used for blowing (i.e., programming) anti-fuses AF-1 and AF-2 and/or reading the state of anti-fuses AF-1 and AF-2. For example, anti-fuse AF-1 is blown by setting CGND=logic 1, FA=logic 1, BSELX_=logic 0, BSELY_=logic 1, MRG_=logic 0, and DVC2F=logic 0; whereas anti-fuse AF-2 is blown by setting CGND=logic 1, FA=logic 1, BSELX_=logic 1, BSELY_=logic 0, MRG_=logic 0, and DVC2F =logic 0.

In the current embodiment, "programming" refers to placing a fuse element into a "blown" state. For example, if the fuse element is an anti-fuse, programming may refer to effectively shorting the two terminal of the anti-fuse such that its resistance is significantly lowered. It should be apparent to one skilled in the art that fuse elements other than anti-fuses may be used while remaining within the scope of the present invention. Thus as a further example, if the fuse element is a laser fuse, programming may refer to cutting or severing one or more strips of metal that constitute the laser fuse. As an yet a further example, if the fuse element is a transistor or another re-programmable fuse device, programming may refer to applying a control signal to place the transistor or other re-programmable fuse device into a low resistance state.

Figure 2:
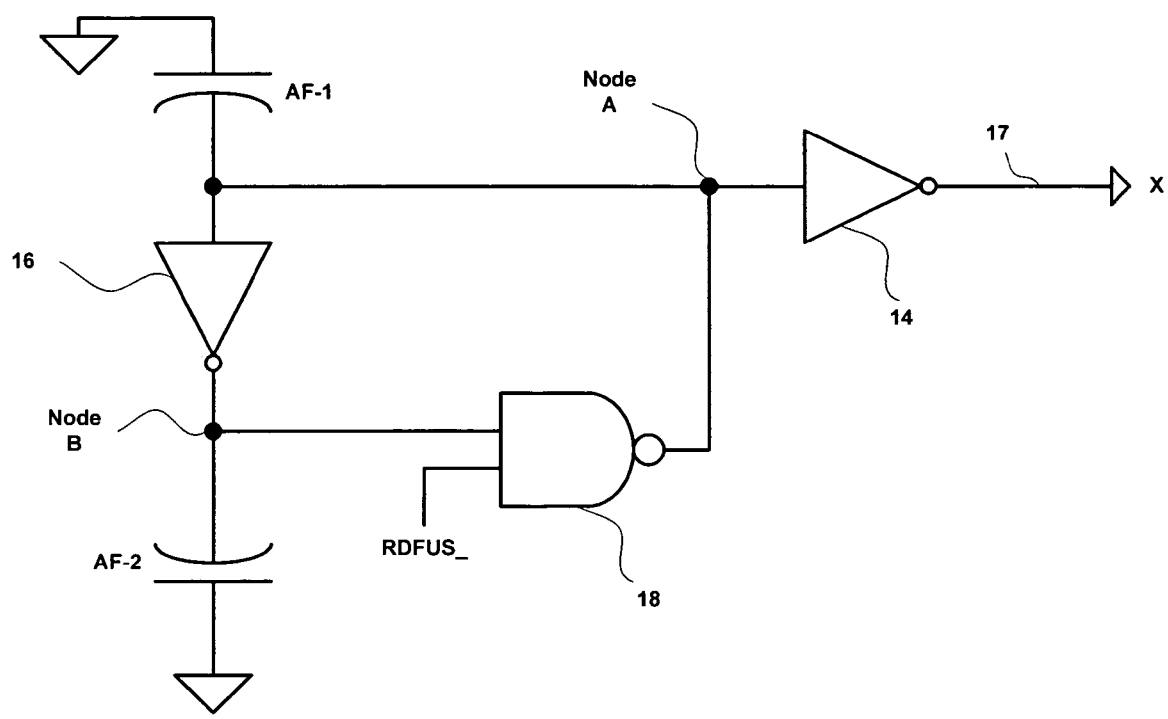
FIG. 2 is a simplified schematic the fuse state detection circuit of FIG. 1 according to one embodiment.

When the memory device is operating under normal conditions, it is assumed that CGND=logic 0, FA=logic 0, BSELX_=logic 0, BSELY_=logic 0, MRG_=logic 0, and DVC2F=logic 1. Under these conditions, the fuse state detection circuit 10 can be "simplified" as illustrated in FIG. 2.

As discussed above, fuse state detection circuit 10 includes two anti-fuses (AF-1 and AF-2). The fuse state detection circuit 10 further includes an output 17 which carries an output signal X. The fuse state detection circuit 10 uses the two anti-fuses (AF-1 and AF-2) to produce the output signal X which represents a "blown" (i.e., programmed) or "unblown" (i.e., unprogrammed) state as would be seen, for example, by another circuit to which the output 17 of the fuse state detection circuit 10 is connected. In the current embodiment, programming anti-fuse AF-1 is used to represent a "blown fuse" at output 17, whereas programming anti-fuse AF-2 is used to represent an "unblown fuse" at output 17. Table 1 is a truth table according to the current embodiment.

TABLE 1

Truth Table for Fuse state detection circuit 10

| AF-1 | AF-2 | Output Signal X |
|---|---|---|
| Unblown | Unblown | Unblown |
| Blown | Unblown | Blown |
| Unblown | Blown | Unblown |
| Blown | Blown | N/A |

By using two fuse elements, the latch required by the prior art fuse state detection circuit 100 is eliminated, and thus, the possibility of a negative triggering event overcoming the latch is also eliminated. Additionally, the fuse state detection circuit 10 of the current embodiment is capable of correcting its output without the need of the RDFUS_pulse should a negative triggering event occur.

Returning briefly to FIG. 1, it should be apparent to one skilled in the art that transistors M8 and M11 act as current limiters. In the current embodiment, M8 and M11 are weak devices. In the case in which anti-fuse AF-1 is blown, node A is pulled low (logic 0), output X is pulled high (logic 1) by inverter 14, and node B is held high (logic 1) by the current through transistor M8. Because transistor M8 is a weak device, its ability to recover, should a negative triggering event occur at node B (i.e., should node B erroneously switch from logic 0 to logic 1), may be inadequate. This could cause the output X to switch to an incorrect state and not be able to recover quickly enough. Thus in the current embodiment, inverter 15 and transistor M16 are added to prevent output X from changing states when a negative triggering occurs at node B when AF-1 is blown. More specifically, if a negative triggering event occurs which causes node B to temporarily flip states (i.e., change from logic 1 to logic 0), the output of inverter 15 also changes state (i.e., changes from logic 0 to logic 1) and deactivates transistor M16. When transistor M16 is deactivated, the inherent capacitance of the output line 17 maintains output X at its high (i.e., logic 1) level. Accordingly, this is one example of the fuse state detection circuit's 10 resistance to a negative triggering event. Once transistor M8 recovers from the negative triggering event, node B returns to logic 1, the output of inverter 15 returns to logic 0, and the transistor M16 is activated to keep output X at logic 1.

In the case in which anti-fuse AF-2 is blown, node B is strongly grounded through anti-fuse AF-2, so the recovery of node B is not as dependent upon the strength of transistor M8 should a negative triggering event occur.

Preferably, only one of the anti-fuses (AF-1 and AF-2) is blown at a given time. Returning now to FIG. 2, if anti-fuse AF-1 is blown, node A is pulled to logic 0 (e.g., GND) and inverter 14 causes output signal X to be set at logic 1 (which is the same output as the original circuit) If the anti-fuse AF-2 is blown, node B is pulled to logic 0 and the output of NAND gate 18 is set at logic 1 (regardless of the logic level of signal RDFUS_). Inverter 14 thus causes the output signal X to be set at logic 0, which represents an unblown fuse in the original circuit.

If a negative triggering event-occurs to the fuse state detection circuit 10, output signal X may change states for a short period of time. The fuse state detection circuit 10, however, will eventually correct itself and output signal X will return to the correct logic state without needing an RDFUS_pulse. For example, node A is pulled to logic 0 when anti-fuse AF-1 is blown as discussed above. If a triggering event forces node A to a logic 1 state, node A will quickly be pulled back to GND (i.e., to logic 0) through blown anti-fuse AF-1. Similarly, node A is pulled to logic 1 when anti-fuse AF-2 is blown as discussed above. If a triggering event forces node A to a logic 0 state, node A will quickly be pulled back to Vcc (i.e., to logic 1) by the output of NAND gate 18. Thus, regardless of whether anti-fuse AF-1 is blown (i.e., representing a blown fuse) or anti-fuse AF-2 is blown (i.e., representing an unblown fuse), the fuse state detection circuit 10 is capable of resetting itself from a negative triggering event without needing a RDFUS_pulse.

Figure 3:
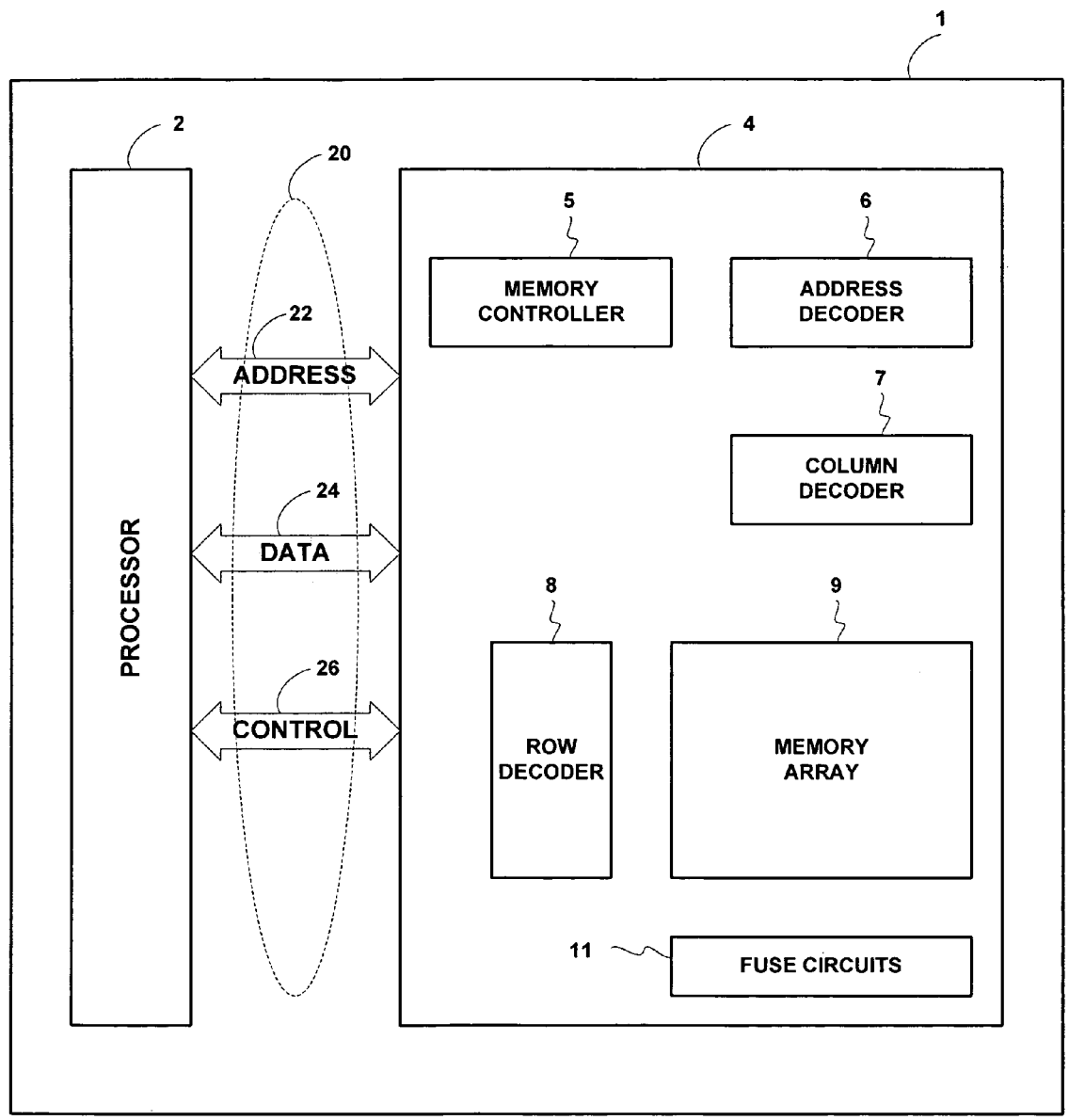
FIG. 3 is a simplified block diagram of a processing system according to one embodiment.

FIG. 3 is a simplified block diagram of a processing system 1 comprised of a microprocessor, micro-controller, ASIC, etc. 2 in communication with a memory device 4. The microprocessor is capable of performing various computing functions, such as executing software functions to perform specific calculations and/or data processing tasks. The processor 2 is capable of performing a plurality of functions based on information and data stored in the memory device 4.

The memory device 4 may, for example, be a dynamic random access memory (DRAM) such as a static dynamic random access memory (SDRAM), a pseudo-static random access memory (PSRAM), and a low-power, extended-refresh dynamic random access memory (LPDRAM), among others. As shown in FIG. 3, various signals are shared between the processor 2 and the memory device 4 via a bus 20. Bus 20 may include, for example, an address bus 22, data bus 24, and control bus 26, among others. For example, cell address signals (ADDRESS), row address strobes (RAS), column address strobes (CAS), data (DQ) signals, write enable (WE) signals, timing (CLOCK) signals, etc. may be shared between the processor 2 and the memory device 4 via bus 20. It should be apparent to one skilled in the art that the illustrated buses and mentioned signals are for exemplary purposes only and not intended to limit the present invention.

The memory device 4 is comprised of a main memory array 9 together with peripheral circuitry to enable data to be read into and out of the memory array 9. The main memory array 9 may be further divided into a number of sub-arrays (not shown). Those of ordinary skill in the art will recognize that peripheral circuitry may include a memory controller 5, an address decoder 6, a column decoder 7, and a row decoder 8, among other components for writing information into and reading information out from main memory array 9. One skilled in the art will recognize that the detailed description of these peripheral circuits is unnecessary as they do form a feature of the present invention. The peripheral circuitry may also include fuse circuits 11. The fuse circuits 11 may be used, for example, to establish the memory device 4 configuration (e.g., X4/X8/X16) and/or various trimming settings (such as voltage levels, part timings, row and column repair/replacement, etc) within the memory device 4. In the current embodiment, the fuse circuits 11 include one or more fuse state detection circuits 10 as discussed above in conjunction with FIGS. 1 and 2. Those of ordinary skill in the art will also recognize that other peripheral circuitry may be included which are not disclosed in detail, as they do not form a feature of the present invention.

Figure 4:
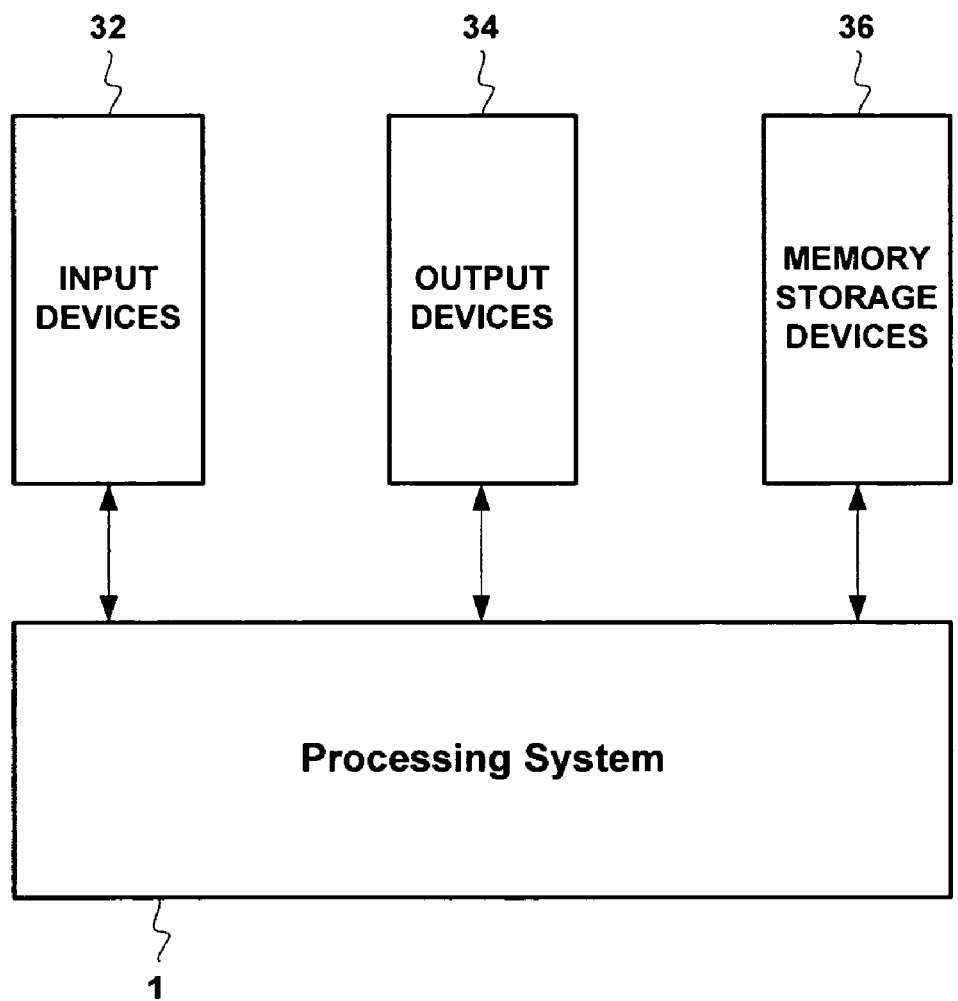
FIG. 4 is a simplified diagram of a computing system according to one embodiment.
Figure 5:
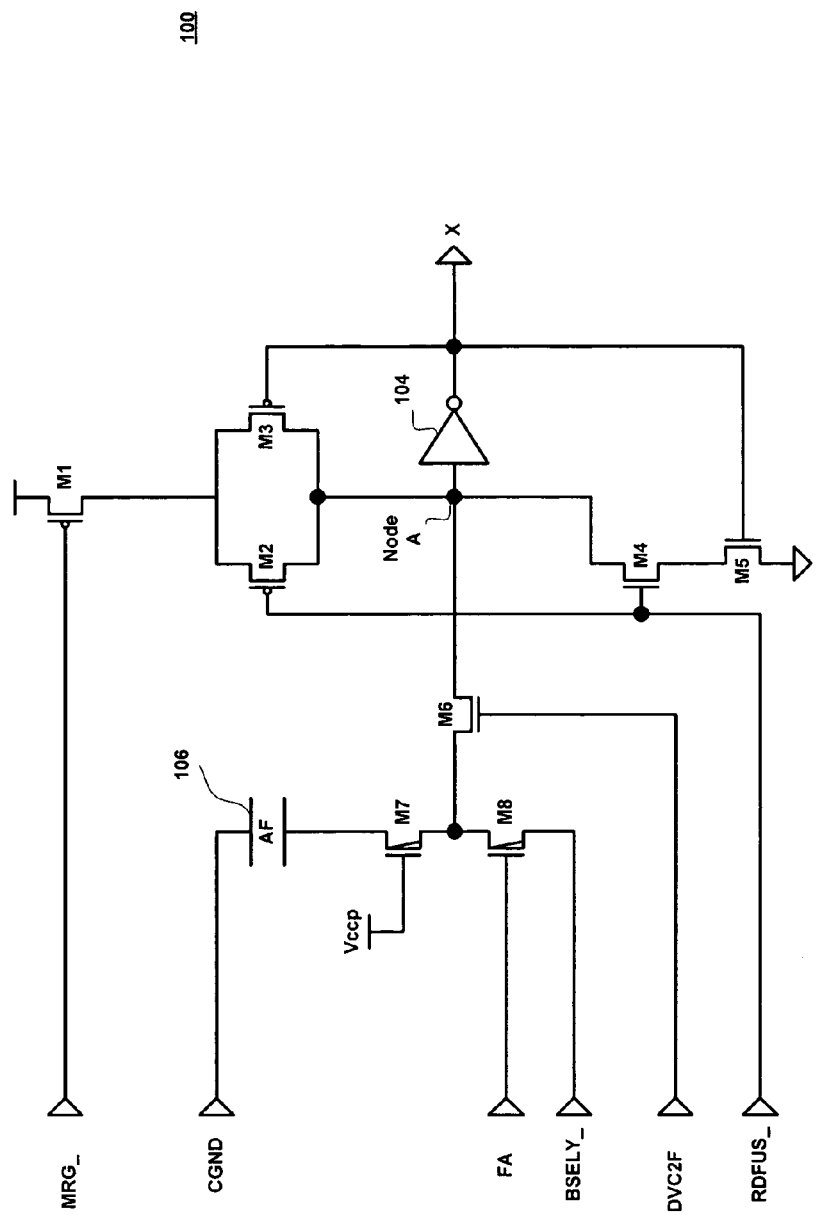
FIG. 5 is a detailed schematic of a fuse state detection circuit according to the prior art.
Figure 6:
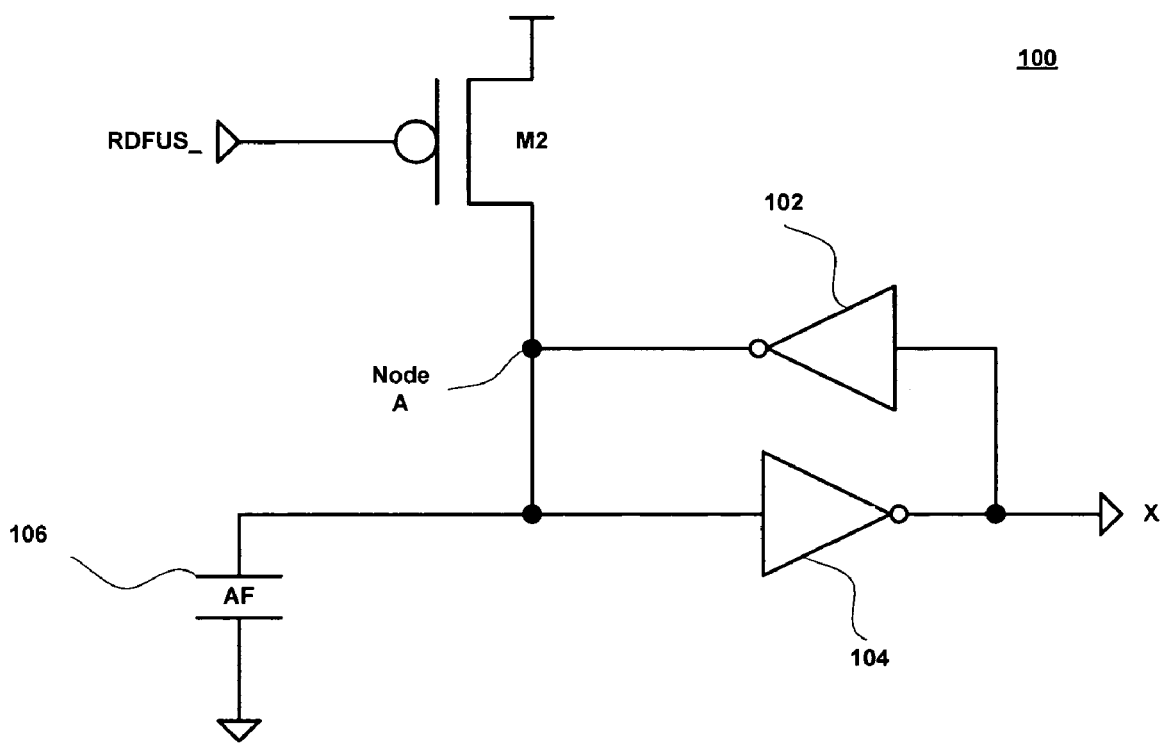
FIG. 6 is a simplified schematic the fuse state detection circuit of FIG. 5 according to the prior art.

FIG. 4 is a block diagram depicting a computing system 30 in which the processing system 1 illustrated in FIG. 3 may be used. The computing system 30 may include one or more input devices 32 (e.g., keyboard, mouse, microphone, bar code reader, RFID reader, etc.) connected to the processing system 1 to allow a user to manually input data, instructions, etc., to operate the processing system 1. One or more output devices 34 (e.g., printers, video terminals, video display units, etc.) connected to the processing system 1 may also be provided as part of the system 30 to display or otherwise output data generated by the processing system 1. The system 30 may also include one or more data storage devices 36 (i.e., CD-ROM, disk drive, tape drive, ZIP drive, etc.) connected to the processing system 1. The data storage devices 36 are operable to store various software and data sets for use by processing system 1. Computing system 30 may also include mixed input/output devices (not shown) such as modems, network interface cards, and touch screens (among others) while remaining within the scope of the present invention.

It should be recognized that the above-described embodiments of the invention are intended to be illustrative only. Those skilled in the art may devise numerous alternative embodiments without departing from the scope of the following claims. For example, the scope of the present invention may extend to other types of fuse elements and is not intended to be limited to anti-fuses. More specifically, laser fuses, re-settable fuses (such as transistors), etc. may be used with or in the place of anti-fuses while remaining within the scope of the present invention.

What is claimed is:

1. A fuse state detection circuit, comprising:
   a first fuse element;
   a second fuse element;
   circuitry responsive to said first and second fuse elements for producing an output signal assuming a first logic state when said first fuse element is blown and said second fuse element is unblown and a second logic state when said first element is unblown and said second element is blown, wherein said circuitry comprises a first inverter and a second inverter, each responsive to said first fuse element; and
   a logic gate responsive to a control signal and to one of said second fuse element and said second inverter, wherein said first inverter is responsive to an output of said logic gate and wherein said output signal of said fuse state detection circuit is responsive to said first inverter.

2. The fuse state detection circuit of claim 1 additionally comprising a first address line for addressing said first fuse element and a second address line for addressing said second fuse element.

3. The fuse state detection circuit of claim 1 wherein at least one of said first fuse element or said second fuse element include one of a laser fuse, an anti-fuse, and a transistor.

4. A fuse state detection circuit, comprising:
   a first fuse element;
   a second fuse element;
   circuitry responsive to said first and second fuse elements so as to produce an output signal whose state is resistant to a negative triggering event, wherein said circuitry comprises a first inverter and a second inverter, each responsive to said first fuse element; and
   a logic gate responsive to a control signal and to one of said second fuse element and said second inverter, wherein said first inverter is responsive to an output of said logic gate and wherein said output signal of said fuse state detection circuit is responsive to said first inverter.

5. The fuse state detection circuit of claim 4 wherein said output signal assumes a first logic state when said first fuse element is blown and said second fuse element is unblown and a second logic state when said first element is unblown and said second element is blown.

6. The fuse state detection circuit of claim 4 additionally comprising a first address line for addressing said first fuse element and a second address line for addressing said second fuse element.

7. The fuse state detection circuit of claim 4 wherein at least one of said first fuse element or said second fuse element include one of a laser fuse, an anti-fuse, and a transistor.

8. A fuse state detection circuit, comprising:
a first fuse element;
a second fuse element; and
circuitry responsive to said first and second fuse elements for producing an output signal, wherein said circuitry is configured to receive a reset pulse and resolve said output signal to the correct state without the need for said reset pulse.

9. The fuse state detection circuit of claim 8 wherein said output signal assumes a first logic state when said first fuse element is blown and said second fuse element is unblown and a second logic state when said first element is unblown and said second element is blown.

10. The fuse state detection circuit of claim 8 wherein said circuitry comprises a first inverter and a second inverter, each responsive to said first fuse element, and a logic gate responsive to a control signal and to one of said second fuse element and said second inverter, wherein said first inverter is responsive to an output of said logic gate and wherein said output signal of said fuse state detection circuit is responsive to said first inverter.

11. The fuse state detection circuit of claim 8 additionally comprising a first address line for addressing said first fuse element and a second address line for addressing said second fuse element.

12. The fuse state detection circuit of claim 8 wherein at least one of said first fuse element or said second fuse element include one of a laser fuse, an anti-fuse, and a transistor.

13. A method of operating a fuse state detection circuit having an input for receiving a reset pulse, comprising:
monitoring the state of a first fuse element;
monitoring the state of a second fuse element; and
producing an output signal that is responsive to the states of said first and said second fuse elements and resolves itself to the correct state without the need for said reset pulse.

14. The method of claim 13 wherein said output signal assumes a first logic state when said first fuse element is blown and said second fuse element is unblown and a second logic state when said first element is unblown and said second element is blown.

15. A memory device, comprising:
an array of memory cells;
a plurality of peripheral devices for reading data out of and writing data into said array of memory cells, said peripheral devices comprising:
 a fuse state detection circuit, comprising:
  a first fuse element;
  a second fuse element; and
  circuitry responsive to said first and second fuse elements for producing an output signal assuming a first logic state when said first fuse element is blown and said second fuse element is unblown and a second logic state when said first element is unblown and said second element is blown, wherein said circuitry comprises a first inverter and a second inverter, each responsive to said first fuse element; and
  a logic gate responsive to a control signal and to one of said second fuse element and said second inverter, wherein said first inverter is responsive to an output of said logic gate and wherein said output signal of said fuse state detection circuit is responsive to said first inverter.

16. The memory device of claim 15 additionally comprising a first address line for addressing said first fuse element and a second address line for addressing said second fuse element.

17. The memory device of claim 15 wherein at least one of said first fuse element or said second fuse element include one of a laser fuse, an anti-fuse, and a transistor.

18. A memory device, comprising:
an array of memory cells;
a plurality of peripheral devices for reading data out of and writing data into said array of memory cells, said peripheral devices comprising:
 a fuse state detection circuit, comprising:
  a first fuse element;
  a second fuse element;
  circuitry responsive to said first and second fuse elements so as to produce an output signal whose state is resistant to a negative triggering event, wherein said circuitry comprises a first inverter and a second inverter, each responsive to said first fuse element; and
  a logic gate responsive to a control signal and to one of said second fuse element and said second inverter, wherein said first inverter is responsive to an output of said logic gate and wherein said output signal of said fuse state detection circuit is responsive to said first inverter.

19. The memory device of claim 18 wherein said output signal assumes a first logic state when said first fuse element is blown and said second fuse element is unblown and a second logic state when said first element is unblown and said second element is blown.

20. The memory device of claim 18 additionally comprising a first address line for addressing said first fuse element and a second address line for addressing said second fuse element.

21. The memory device of claim 18 wherein at least one of said first fuse element or said second fuse element include one of a laser fuse, an anti-fuse, and a transistor.

22. A memory device, comprising:
an array of memory cells;
a plurality of peripheral devices for reading data out of and writing data into said array of memory cells, said peripheral devices comprising:
 a fuse state detection circuit, comprising:
  a first fuse element;
  a second fuse element; and
  circuitry responsive to said first and second fuse elements for producing an output signal, wherein said circuitry is configured to receive a reset pulse and resolve said output signal to the correct state without the need for said reset pulse.

23. The memory device of claim 22 wherein said output signal assumes a first logic state when said first fuse element is blown and said second fuse element is unblown and a second logic state when said first element is unblown and said second element is blown.

24. The memory device of claim 22 wherein said circuitry comprises a first inverter and a second inverter, each responsive to said first fuse element, and a logic gate responsive to a control signal and to one of said second fuse element and said second inverter, wherein said first inverter is responsive to an output of said logic gate and wherein said output signal of said fuse state detection circuit is responsive to said first inverter.

25. The memory device of claim 22 additionally comprising a first address line for addressing said first fuse element and a second address line for addressing said second fuse element.

26. The memory device of claim 22 wherein at least one of said first fuse element or said second fuse element include one of a laser fuse, an anti-fuse, and a transistor.

27. A system, comprising:
a processor;
a memory device; and
a bus for connecting said processor to said memory device, said memory device comprising:
an array of memory cells;
a plurality of peripheral devices for reading data out of and writing data into said array of memory cells, said peripheral devices comprising:
a fuse state detection circuit, comprising:
a first fuse element;
a second fuse element;
circuitry responsive to said first and second fuse elements for producing an output signal assuming a first logic state when said first fuse element is blown and said second fuse element is unblown and a second logic state when said first element is unblown and said second element is blown, wherein said circuitry comprises a first inverter and a second inverter, each responsive to said first fuse element; and
a logic gate responsive to a control signal and to one of said second fuse element and said second inverter, wherein said first inverter is responsive to an output of said logic gate and wherein said output signal of said fuse state detection circuit is responsive to said first inverter.

28. The system of claim 27 additionally comprising a first address line for addressing said first fuse element and a second address line for addressing said second fuse element.

29. The system of claim 27 wherein at least one of said first fuse element or said second fuse element include one of a laser fuse, an anti-fuse, and a transistor.

30. A system, comprising:
a processor;
a memory device; and
a bus for connecting said processor to said memory device, said memory device comprising:
an array of memory cells;
a plurality of peripheral devices for reading data out of and writing data into said array of memory cells, said peripheral devices comprising:
a fuse state detection circuit, comprising:
a first fuse element;
a second fuse element;
circuitry responsive to said first and second fuse elements so as to produce an output signal whose state is resistant to a negative triggering event, wherein said circuitry comprises a first inverter and a second inverter, each responsive to said first fuse element; and
a logic gate responsive to a control signal and to one of said second fuse element and said second inverter, wherein said first inverter is responsive to an output of said logic gate and wherein said output signal of said fuse state detection circuit is responsive to said first inverter.

31. The system of claim 30 wherein said output signal assumes a first logic state when said first fuse element is blown and said second fuse element is unblown and a second logic state when said first element is unblown and said second element is blown.

32. The system of claim 30 additionally comprising a first address line for addressing said first fuse element and a second address line for addressing said second fuse element.

33. The system of claim 30 wherein at least one of said first fuse element or said second fuse element include one of a laser fuse, an anti-fuse, and a transistor.

34. A system, comprising:
a processor;
a memory device; and
a bus for connecting said processor to said memory device, said memory device comprising:
an array of memory cells;
a plurality of peripheral devices for reading data out of and writing data into said array of memory cells, said peripheral devices comprising:
a fuse state detection circuit, comprising:
a first fuse element;
a second fuse element; and
circuitry responsive to said first and second fuse elements for producing an output signal, wherein said circuitry is configured to receive a reset pulse and resolve said output signal to the correct state without the need for said reset pulse.

35. The system of claim 34 wherein said output signal assumes a first logic state when said first fuse element is blown and said second fuse element is unblown and a second logic state when said first element is unblown and said second element is blown.

36. The system of claim 34 wherein said circuitry comprises a first inverter and a second inverter, each responsive to said first fuse element, and a logic gate responsive to a control signal and to one of said second fuse element and said second inverter, wherein said first inverter is responsive to an output of said logic gate and wherein said output signal of said fuse state detection circuit is responsive to said first inverter.

37. The system of claim 34 additionally comprising a first address line for addressing said first fuse element and a second address line for addressing said second fuse element.

38. The system of claim 34 wherein at least one of said first fuse element or said second fuse element include one of a laser fuse, an anti-fuse, and a transistor.

* * * * *

UNITED STATES PATENT AND TRADEMARK OFFICE
CERTIFICATE OF CORRECTION

PATENT NO. : 7,276,955 B2
APPLICATION NO. : 11/106100
DATED : October 2, 2007
INVENTOR(S) : Mohr et al.

Page 1 of 1

It is certified that error appears in the above-identified patent and that said Letters Patent is hereby corrected as shown below:

In column 11, line 52, in Claim 15, after "element;" delete "and".

Signed and Sealed this

Eighteenth Day of December, 2007

JON W. DUDAS
*Director of the United States Patent and Trademark Office*